United States Patent [19]
Gardner et al.

[11] Patent Number: 6,159,814
[45] Date of Patent: Dec. 12, 2000

[54] SPACER FORMATION BY POLY STACK DOPANT PROFILE DESIGN

[75] Inventors: Mark Gardner, Cedar Creek; Fred Hause; Charles May, both of Austin, all of Tex.

[73] Assignee: Advanced, Micro Devices, Inc., Sunnyvale, Calif.

[21] Appl. No.: 08/968,444

[22] Filed: Nov. 12, 1997

[51] Int. Cl.$^7$ .................................................. H01L 21/336
[52] U.S. Cl. .......................... 438/305; 438/303; 438/595
[58] Field of Search ..................... 438/305, 303, 438/301, 299, 585, 528, 532, FOR 158, 595

[56] References Cited

U.S. PATENT DOCUMENTS

| | | | |
|---|---|---|---|
| 4,198,250 | 4/1980 | Jecmen | 438/301 |
| 4,775,642 | 10/1988 | Chang et al. | 438/258 |
| 5,030,582 | 7/1991 | Miyajima et al. | 438/305 |
| 5,118,639 | 6/1992 | Roth et al. | 438/305 |
| 5,710,054 | 1/1998 | Gardner et al. | 438/305 |
| 5,744,371 | 4/1998 | Kadosh et al. | 438/305 |
| 5,783,469 | 7/1998 | Gardner et al. | 438/199 |
| 5,798,291 | 8/1998 | Lee et al. | 438/301 |

Primary Examiner—Michael Trinh

[57] ABSTRACT

A method for forming a semiconductor device to produce graded doping in the source region and the drain region includes the steps of implanting the gate material, usually a polysilicon, with a dopant ion that varies the level of oxide formation on the gate. The dopant ion is driven into undoped polysilicon. Nitrogen ions, may also be implanted in the polysilicon to contain the previously implanted ions. For N-type transistors, typically arsenic is implanted. For P-type transistors, typically boron is implanted. Gates are formed. The gate structure is then oxidized. The oxidation process is controlled to grow a desired thickness of silicon dioxide on the gate. The portion of the gate carrying the dopant grows silicon dioxide either more quickly or more slowly. An isotropic etch can then used to remove a portion of the silicon oxide and form a knob on each sidewall of the gate. A heavy ion implant is then done to convert a portion of the lightly doped source region into a heavily doped region within the source region, and to convert a portion of the lightly doped drain region into a heavily doped region within the drain region. Some of the implanted ions are stopped by the knobs on the gate sidewalls. The regions under the knobs do not have as deep an ion implantation resulting in a shallow region beneath the knob. This forms a graded junction having a specific geometry. The geometry of the interface between the lightly doped region and the heavily doped region in the source region and the drain region depends on the geometry (thickness) of silicon dioxide knobs formed on the sidewall of the gate.

10 Claims, 4 Drawing Sheets

SPACER FORMATION BY POLY STACK DOPANT PROFILE DESIGN

FIELD OF THE INVENTION

The present invention relates generally to integrated circuit manufacturing and more particularly to forming insulated gate field effect transistors.

BACKGROUND OF THE INVENTION

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packing density and reduce parasitic overlap capacitances between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate which provides a mask during formation of the source and drain by ion implantation. Thereafter, a drive-in step is applied to repair crystalline damage and to drive-in and activate the implanted dopant.

As IGFET dimensions are reduced and the supply voltage remains constant (e.g., 3 V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate, and a heavy implant is self-aligned to the gate on which sidewall spacers have been formed. The spacers are typically oxides or nitrides. The purpose of the lighter first dose is to form a lightly doped region of the drain (or Ldd) at the edge near the channel. The second heavier dose forms a low resistivity heavily doped region of the drain, which is subsequently merged with the lightly doped region. Since the heavily doped region is farther away from the channel than a conventional drain structure, the depth of the heavily doped region can be made somewhat greater without adversely affecting the device characteristics. The lightly doped region is not necessary for the source (unless bidirectional current is used), however lightly doped regions are typically formed for both the source and drain to avoid additional processing steps.

Including a heavily doped portion and a lightly doped portion in a source or drain is referred to as having graded doping within the source and drain. MOSFETs without graded doping generally have a shortened life which is well below the industry-wide design point of a 10-year life. To extend the life of an IGFET, a drain with a graded, or lightly doped extension is produced. Due to processing steps, a graded source is also produced. Qualitatively, $\epsilon_{ymax}$ is reduced by such a graded or lightly doped extension or buffer region because the maximum electric field in a reverse-biased pn junction is highest when the junction is abrupt. By replacing the abrupt drain doping profile of a conventional IGFET with a drain that has a more gradually decreasing lateral doping profile (i.e., a graded drain), the voltage drop becomes shared by the drain and the channel, in contrast to an abrupt $n^+/p$ drain junction, in which almost the entire voltage drop occurs across the lightly doped (channel) side of the junction. The model equation for $\epsilon_{ymax}$ is provided below:

$$\epsilon_{ymax}=(V_{DS}-V_{DSsat})/l \qquad \text{(Equation 1)}$$

where, $\epsilon_{ymax}$ is the maximum channel electric field, l is the channel length, $V_{DS}$ is the voltage across the channel and $V_{DSsat}$ is the voltage across the channel at saturation. $\epsilon_{ymax}$ is significantly reduced by the presence of such a lightly doped region because this is another way to increase the denominator of Equation 1.

Graded-drain regions can be created in IGFETs in a number of ways, including: (1) using phosphorus in place of As as the dopant of the source/drain regions; (2) adding fast diffusing phosphorus to an As-doped drain region, and driving the phosphorus laterally ahead of the arsenic with a high temperature diffusion step to create a double-diffused drain [DDD] structure; and (c) pulling the highly doped ($n^+$) drain region away from the gate edge with an "oxide spacer" to create a lightly doped drain (LDD) structure.

Each of these methods requires a number of processing steps. A method is needed which reduces the number of processing steps. The formation of spacers by the deposition and etch method is one subprocess that requires many steps.

SUMMARY OF THE INVENTION

A method for forming a semiconductor device to produce graded doping in the source region and the drain region includes the steps of implanting the gate material, usually a polysilicon, with a dopant ion that varies the level of oxide formation on the gate. The dopant ion is driven into undoped polysilicon. Nitrogen ions, may also be implanted in the polysilicon to contain the previously implanted ions. For N-type transistors, typically arsenic is implanted. For P-type transistors, typically boron is implanted. Gates are formed. The gate structure is then oxidized. The oxidation process is controlled to grow a desired thickness of silicon dioxide on the gate. The portion of the gate carrying the dopant grows silicon dioxide either more quickly or more slowly. An isotropic etch can then used to remove a portion of the silicon oxide and form a knob on each sidewall of the gate. A heavy ion implant is then done to convert a portion of the lightly doped source region into a heavily doped region within the source region, and to convert a portion of the lightly doped drain region into a heavily doped region within the drain region. Some of the implanted ions are stopped by the knobs on the gate sidewalls. The regions under the knobs do not have as deep an ion implantation resulting in a shallow region beneath the knob. This forms a graded junction having a specific geometry. The geometry of the interface between the lightly doped region and the heavily doped region in the source region and the drain region depends on the geometry (thickness) of silicon dioxide knobs formed on the sidewall of the gate and on the length of the knob.

Advantageously, the dimensions of the silicon dioxide knob can be varied to form a graded channel having a different geometry. The steps are easily performed and one implantation for heavy doping is all that is needed to form the graded junction or doping pattern. The resulting device has a longer life, is more reliable and less likely to fail than devices without graded doped drains and sources. In addition, the geometry of the doping profile can be controlled more precisely using this invention. Information handling systems including such a device are also more reliable and long lived.

An additional advantage is that by using this invention, the formation of spacers by the conventional deposition and etch methods is eliminated.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1A:
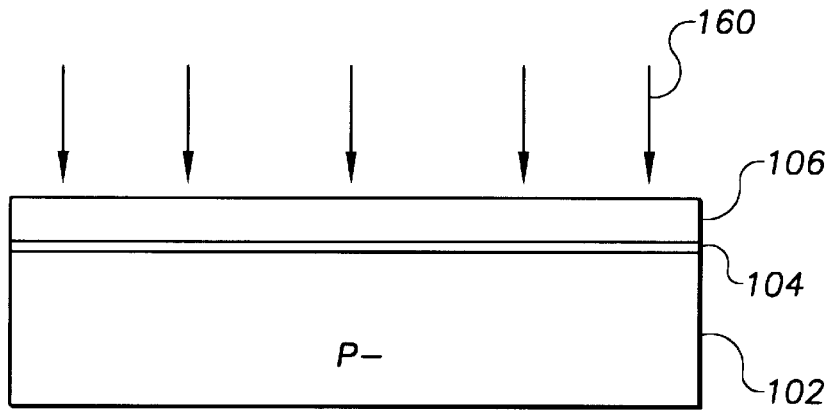
FIGS. 1A–1H show cross-sectional views of successive process steps for making an IGFET with graded doping in the drain region and source region in accordance with an embodiment of the invention.

Described first is an NPN type transistor also known as an NMOSFET. In FIG. 1A, silicon substrate 102 suitable for integrated circuit manufacture includes P-type epitaxial layer with a boron background concentration on the order of $1\times10^6$ atoms/cm$^3$, a <100> orientation and a resistivity of 12 ohm-cm. Preferably, the epitaxial surface layer is disposed on a P+ base layer (not shown) and includes a planar top surface. Gate oxide 104, composed of silicon dioxide (SiO2), is formed on the top surface of substrate 102 using oxide tube growth at a temperature of 700° to 1000° C. in an $O_2$ containing ambient. A typical oxidation tube contains several sets of electronically powered heating coils surrounding the tube, which is either quartz, silicon carbide, or silicon. In $O_2$ gas oxidation, the wafers are placed in the tube in a quartz "boat" or "elephant" and the gas flow is directed across the wafer surfaces to the opposite or exhaust end of the tube. Gate oxide 104 has a thickness of 50 angstroms.

Thereafter, a blanket layer of undoped polysilicon 106 is deposited by low pressure chemical vapor deposition (LPCVD) on the top surface of gate oxide 104. Polysilicon 106 has a thickness of 2000 angstroms. If desired, polysilicon 106 can be doped in situ as deposition occurs, or doped before a subsequent etch step by implanting arsenic with a dosage in the range of $5\times10^{14}$ to $5\times10^{15}$ atoms/cm$^2$ and an energy in the range of 2 to 80 kiloelectron-volts. However, it is generally preferred that polysilicon 106 be doped during an implantation step following a subsequent etch step.

In FIG. 1A, the polysilicon 106 deposited on the substrate 102 is implanted with arsenic ions and then with nitrogen ions, as depicted by the arrows 160. The arsenic ions enhance the rate of silicon dioxide growth in subsequent oxidation processes used to add or grow an additional layer of silicon dioxide. The arsenic ion implant has a dosage in the range of $5\times10^{14}$ to $5\times10^{15}$ and an energy level ranging between 2 to 80 kiloelectron-volts. Doping with nitrogen is optional. The arrows 160 depict either the single step of doping with arsenic ions, or the two steps of doping with arsenic and then doping with nitrogen ions. The nitrogen ions may be added to retard the diffusion of the arsenic atoms. If the polysilicon is to be doped with nitrogen ions, the polysilicon may be implanted at this point in the process at a dosage of $5\times10^{14}$ to $1\times10^{16}$ atoms/cm$^2$ and at an energy level of 20 to 200 kiloelectron-volts. Nitrogen ions may be implanting after etching the polysilicon (discussed with respect to FIG. 1D below).

Figure 1B:
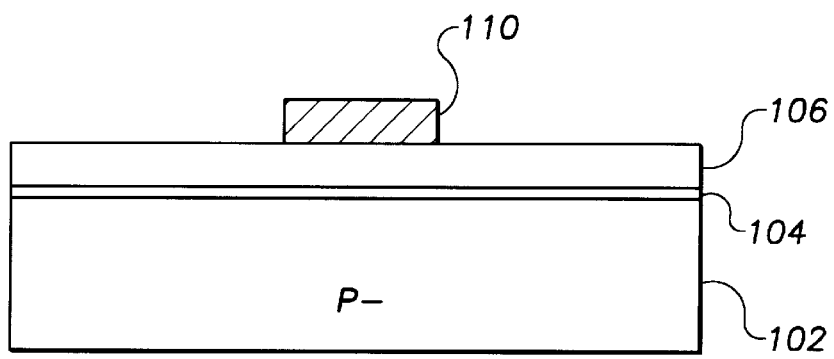

In FIG. 1B, photoresist 110 is deposited as a continuous layer on polysilicon 106 and selectively irradiated using a photolithographic system, such as a step and repeat optical projection system, in which I-line ultraviolet light from a mercury-vapor lamp is projected through a first reticle and a focusing lens to obtain a first image pattern. Thereafter, the photoresist 110 is developed and the irradiated portions of the photoresist are removed to provide openings in photoresist 110. The openings expose portions of polysilicon 106, thereby defining a gate.

Figure 1C:
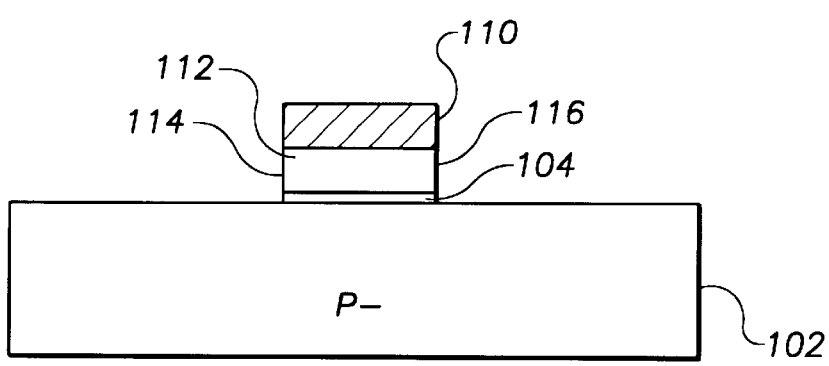

In FIG. 1C, an anisotropic etch is applied that removes the exposed portions of polysilicon 106 and the underlying portions of gate oxide 104. Preferably, a first dry etch is applied that is highly selective of polysilicon, and a second dry etch is applied that is highly selective of silicon dioxide, using photoresist 110 as an etch mask. After etching occurs, the remaining portion of polysilicon 106 provides polysilicon gate 112 with opposing vertical sidewalls 114 and 116. Polysilicon gate 112 has a length (between sidewalls 114 and 116) of 3500 angstroms.

Figure 1D:
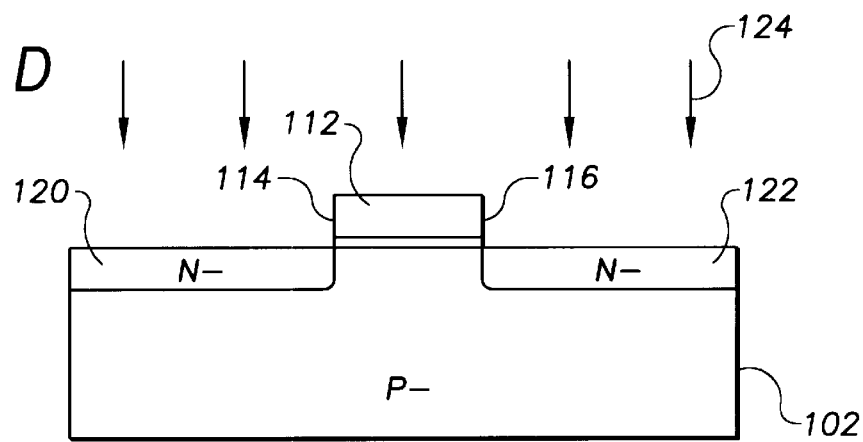

In FIG. 1D, photoresist 110 is stripped, and lightly doped source and drain regions 120 and 122 are implanted into substrate 102 by subjecting the structure to ion implantation of phosphorus, indicated by arrows 124, at a dose in the range of $1\times10^{13}$ to $5\times10^{14}$ atoms/cm$^2$ and an energy in the range of 2 to 35 kiloelectron-volts. Polysilicon gate 112 provides an implant mask for the underlying portion of substrate 102. As a result, lightly doped source and drain regions 120 and 122 are substantially aligned with sidewalls 114 and 116, respectively. Lightly doped source and drain regions 120 and 122 are doped N− with a phosphorus concentration in the range of about $1\times10^{17}$ to $5\times10^{18}$ atoms/cm$^3$.

Figure 1E:
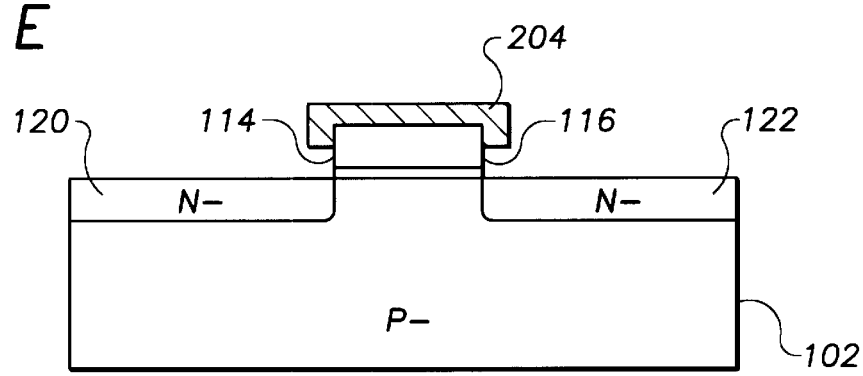
Figure 1F:
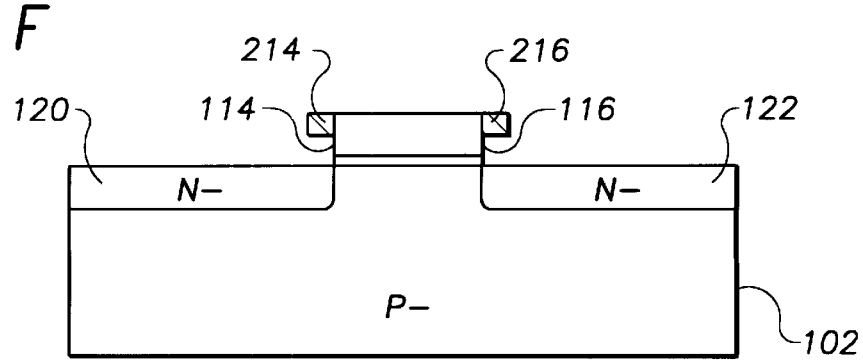

As shown in FIG. 1E, an oxide layer (shown as a cross hatched portion) 204 is grown on the resulting gate structure. The oxide layer 204, composed of silicon dioxide (SiO$_2$), is formed on the top portion of gate 112 using oxide tube growth at a temperature of 700° to 1000° C. in an $O_2$ containing ambient. The oxide layer can also be formed using rapid thermal annealing (RTA). RTA has several advantages over the use of an oxide tube, including less warpage of the wafers and localized heating.

The resulting oxide layer 204 is not uniform. The previous implant of arsenic in the polysilicon material of the gate enhances the oxidation rate in the top of the gate. In other words, the oxide layer 204 will grow faster in a material that is doped with arsenic when compared to a material not doped with arsenic. The arsenic ions are only implanted to a depth less than the entire thickness of the polysilicon gate 112. The depth of the arsenic implant corresponds to the length of the thicker portion of the oxide growth on the sidewalls 114 and 116 shown. The rate of oxidation is in an arsenic implanted region is enhanced at a ratio in the range of 4:1 to 8:1 when compared to the rate of oxidation in a non-implanted arsenic region. As a result, the portion of the gate 112 implanted with arsenic forms a thicker oxide layer while being thermally treated to produce the oxide layer 204. It should be noted that a thinner layer of oxide will also grow on the other portions of the sidewalls 114 and 116 as well as on the top portion of the lightly doped source and drain regions 120 and 122. The additional thin oxide layer is not shown in FIGS. 1E–1H for the sake of simplicity. Also, for the sake of simplicity, the oxide layer is shown in FIG. 1E with square corners. It should be noted that although the gate 112 is shown with an oxide layer with very square corners, in practice the corners may be more rounded.

The optional step of implanting nitrogen atoms into the polysilicon layer 106 or into the gate 112 is used to inhibit the migration of the arsenic ions during the heating process used in forming the gate, growing silicon dioxide on the surface of the gate and in subsequent processing steps.

As shown in FIG. IF, a portion of the oxide layer 204 is removed leaving a first silicon dioxide knob 214 (shown as a cross hatched portion) on sidewall 114 and a second silicon dioxide knob 216 (shown as a cross hatched portion) on sidewall 116. The top portion of the oxide layer 204 is removed using an isotropic etching process. Isotropic etching is achieved by using either a wet chemistry-liquid/vapor process or by a dry plasma process.

Figure 1G:
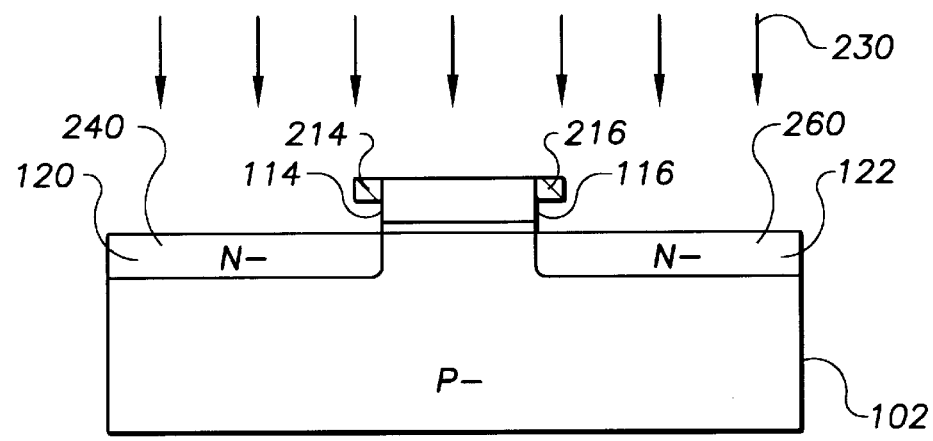

In FIG. 1G, a portion of the lightly doped source region 120 is converted into heavily doped source region 240, and a portion of the lightly doped drain region 122 is converted into a heavily doped drain region 260 by subjecting the structure to ion implantation of arsenic, indicated by arrows 230, at a dose in the range of $2 \times 10^{15}$ to $5 \times 10^{15}$ atoms/cm$^2$ and an energy in the range of 10 to 80 kiloelectron-volts. The polysilicon gate 112 provides an implant mask for the underlying portion of substrate 102. The first silicon dioxide knob 214 (shown as a cross hatched portion) on sidewall 114, and a second silicon dioxide knob 216 (shown as a cross hatched portion) also act as a partial mask or serve to absorb a portion of the ions being implanted.

Figure 1H:
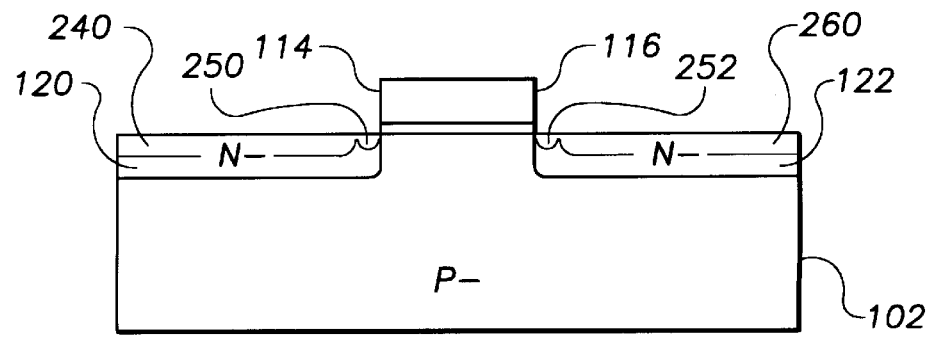

The result is a graded dope drain and source having a heavily doped source region 240 and a heavily doped drain region 260 with a cross section such as is shown in FIG. 1H. The heavily doped source region 240 includes a first shallow portion 250 having one end aligned with the side wall 114 and a second end aligned with the end of the silicon dioxide knob 214 (removed in FIG. 1H but shown in FIG. 1G). The heavily doped region also has a second shallow portion 252 having one end aligned with the side wall 116 and a second end aligned with the end of the silicon dioxide knob 216 (removed in FIG. 1H but shown in FIG. 1G). Portions of the source 120 and the drain 122 remain lightly doped. Heavily doped source region 240 and heavily doped drain region 260 is doped N+ with an arsenic concentration in the range of about $1 \times 10^{19}$ to $1 \times 10^{20}$ atoms/cm$^3$. Of course, it should be noted that the shallow portions 250 and 252 can be made more shallow by driving arsenic more deeply into the polysilicon so that the resulting silicon dioxide knob 214 and the silicon dioxide knob 216 are have a longer length with respect to the sidewalls, 114 and 116. The isotropic etching, discussed with respect to FIG. 1F, can also be controlled to leave an additional amount of polysilicon 204 on the gate 112. This provides for a longer silicon dioxide knobs 214 and 216 and a shallower heavily doped region beneath the silicon dioxide knobs 214 and 216. The geometry of the silicon dioxide knobs 214 and 216 can be controlled to control the geometry of the heavily doped region. The depth of the implant into the polysilicon can be controlled to control the height of the silicon dioxide knob. The height can also be controlled by the amount of isotropic etch. In other words, the silicon dioxide knobs 214 and 216 will have a longer height dimension if some silicon dioxide is left on top of the gate 112. The width of the silicon dioxide knobs 214 and 216 can be controlled by varying the oxidation process. If less wide knobs 214 and 216 are desired, the length of time for oxidation can be reduced. The width of the silicon dioxide knobs typically ranges from 200–600 angstroms. In the portion of the gate where nitrogen ions are placed, the oxide layer of about 40–50 angstroms results.

Further processing steps in the fabrication of IGFETs typically include forming salicide contacts on the gate, source and drain, forming a thick oxide layer over the active region, forming contact windows in the oxide layer to expose the salicide conforming interconnect metallization in the contact windows, and forming a passivation layer over the interconnect metallization. Salicidation includes the formation of spacers on the gate, depositing a metal layer over the entire resulting surface and reacting the metal to form a salicide on top of the gate 112, on the top of the source 120 and on the top of the drain 122. Unreacted metal is then removed, glass is placed over the surface and a contact opening is formed for connectors. A passivation layer may also then deposited as a top surface. In addition, earlier or subsequent high-temperature process steps can be used to supplement or replace the desired anneal, activation, and drive-in functions. These further processing steps are conventional and need not be repeated herein. Likewise the principal processing steps disclosed herein may be combined with other steps apparent to those skilled in the art.

The present invention includes numerous variations to the embodiment described above. For instance, the gate insulator and spacers and can be various dielectrics including silicon dioxide, silicon nitride and silicon oxynitride. Suitable N-type dopants include arsenic, phosphorus and combinations thereof. Alternatively, if a P-channel device is desired, suitable P-type dopants include boron, boron species (such as boron difluoride) and combinations thereof.

Figure 2:
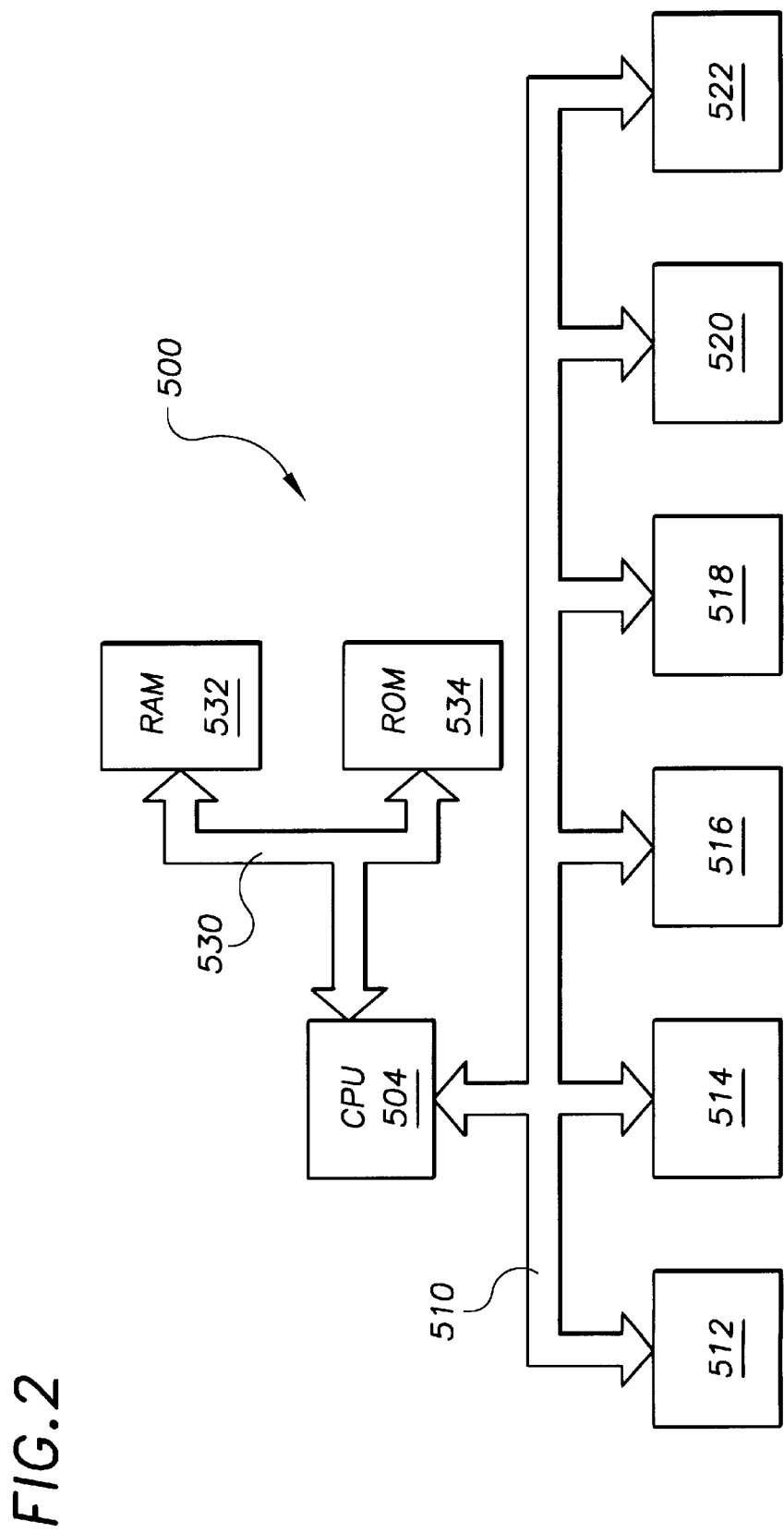
FIG. 2 is a schematic of an information handling system.

Advantageously, the invention is well-suited for use in a device such as an integrated circuit chip, as well as an electronic system including a central processing unit, a memory and a system bus. The electronic system may also be an information handling system 500 as shown in FIG. 2. The information handling system 500 includes a central processing unit 504, a random access memory 532, and a system bus 530 for communicatively coupling the central processing unit 504 and the random access memory 532. The information handling system 500 includes a device formed by the steps shown in FIGS. 1A–1H, as described above. The system 500 may also include an input/output bus 510 and several devices peripheral devices, such as 512, 514, 516, 518, 520, and 522 may be attached to the input output bus 510. Peripheral devices may include hard disk drives, floppy disk drives, monitors, keyboards and other such peripherals. The graded doping region in the device provides for a fast and reliable channel having a long life. Faster channels are needed as clocking speeds for microprocessors climb and the channel must also be reliable and long-lived. The graded doping region can be formed in one ion implant step rather than several. This provides for a much more controlled process.

Although specific embodiments have been illustrated and described herein, it is appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the claims and the equivalents thereof.

What is claimed is:

1. A method for forming a device comprising the steps of:

providing a semiconductor substrate;

forming a gate oxide on the surface of the substrate;

depositing a polysilicon layer on the surface of the gate oxide;

implanting first ions into the polysilicon layer;

masking and etching the polysilicon layer to form a gate structure;

implanting second ions into the substrate to form a lightly doped drain region and a lightly doped source region;

forming an oxidation layer on the gate structure, the oxidation layer having a thickness extending above the gate structure;

etching the oxidation layer and substrate and leaving an oxide layer on sidewalls of the gate structure; and converting a portion of the lightly doped source and drain regions into heavily doped source and drain regions, including shaping the heavily doped regions immediately adjacent the gate structure as a function of the thickness of the oxidation layer.

2. The method of claim 1 wherein the first ions implanted are arsenic ions.

3. The method of claim 2 further comprising the step of implanting nitrogen ions into the polysilicon layer.

4. The method of claim 3 wherein the nitrogen ions are driven deeper into the polysilicon layer than the arsenic ions in the polysilicon layer.

5. The method of claim 4 wherein a region of the gate structure implanted with the arsenic ions produces a thicker oxidation layer during the step of forming the oxidation layer on the gate structure than the layer formed in a region of the gate structure implanted with nitrogen ions.

6. The method of claim 5 further comprising the steps of applying a ion implantation to convert a portion of the lightly doped source region into a heavily doped source region, and a portion of the lightly doped drain region into a heavily doped drain region.

7. The method of claim 5, wherein the step of converting includes:

applying a third ion implantation.

8. The method of claim 7 wherein the region of the gate structure implanted with the arsenic ions is adjusted to produce a selected geometry at the interface of the lightly doped region and the heavily doped region of the source and drain.

9. The method of claim 1 wherein the first ions implanted are boron ions.

10. The method of claim 9 further comprising the step of implanting nitrogen ions into the polysilicon layer, said implanted nitrogen ions acting as a barrier for the boron ions.

* * * * *

UNITED STATES PATENT AND TRADEMARK OFFICE
CERTIFICATE OF CORRECTION

PATENT NO. : 6,159,814 Page 1 of 1
DATED : December 12, 2000
INVENTOR(S) : Gardner et al.

It is certified that error appears in the above-identified patent and that said Letters Patent is hereby corrected as shown below:

<u>Abstract,</u>
Line 14, "then used" should read -- then be used --.

<u>Column 2,</u>
Line 61, "then used should read -- then be used --.

<u>Column 3,</u>
Line 65, please delete the indent before "Thereafter".

<u>Column 6,</u>
Line 2, "216 are have" should read -- 216 have --.
Line 36, "then deposited" should read -- then be deposited --.

Signed and Sealed this

Twenty-fifth Day of September, 2001

*Attest:*

*Nicholas P. Godici*

*Attesting Officer*

NICHOLAS P. GODICI
*Acting Director of the United States Patent and Trademark Office*